United States Patent
Fukaya et al.

(10) Patent No.: US 9,695,332 B2
(45) Date of Patent: Jul. 4, 2017

(54) RELEASE FILM FOR PRODUCING GREEN SHEET AND METHOD OF PRODUCING RELEASE FILM FOR PRODUCING GREEN SHEET

(71) Applicant: LINTEC CORPORATION, Tokyo (JP)

(72) Inventors: Tomomi Fukaya, Tokyo (JP); Shinya Ichikawa, Tokyo (JP)

(73) Assignee: Lintec Corporation, Tokyo (JP)

( * ) Notice: Subject to any disclaimer, the term of this patent is extended or adjusted under 35 U.S.C. 154(b) by 479 days.

(21) Appl. No.: 14/389,344

(22) PCT Filed: Mar. 14, 2013

(86) PCT No.: PCT/JP2013/057176
§ 371 (c)(1),
(2) Date: Sep. 29, 2014

(87) PCT Pub. No.: WO2013/146294
PCT Pub. Date: Oct. 3, 2013

(65) Prior Publication Data
US 2015/0072108 A1   Mar. 12, 2015

(30) Foreign Application Priority Data

Mar. 30, 2012 (JP) .................................. 2012-083080

(51) Int. Cl.
| | | |
|---|---|---|
| C09D 135/02 | (2006.01) | |
| B05D 3/06 | (2006.01) | |
| G03F 7/027 | (2006.01) | |
| G03F 7/031 | (2006.01) | |
| G03F 7/038 | (2006.01) | |
| G03F 7/075 | (2006.01) | |
| C08F 2/48 | (2006.01) | |
| C08F 222/10 | (2006.01) | |

(52) U.S. Cl.
CPC ........... *C09D 135/02* (2013.01); *B05D 3/067* (2013.01); *C08F 2/48* (2013.01); *G03F 7/027* (2013.01); *G03F 7/031* (2013.01); *G03F 7/0388* (2013.01); *G03F 7/0757* (2013.01); *C08F 222/1006* (2013.01); *C08F 2222/1046* (2013.01); *Y10T 428/24355* (2015.01)

(58) Field of Classification Search
CPC .............................. C09D 135/02; B05D 3/067
See application file for complete search history.

(56) References Cited

U.S. PATENT DOCUMENTS

2003/0155064 A1   8/2003   Katsuyama
2010/0317173 A1   12/2010  Kanai

FOREIGN PATENT DOCUMENTS

| CN | 101606229 A | 12/2009 | | |
|---|---|---|---|---|
| JP | 2002-160208 | * | 6/2002 | ............ B28B 1/30 |
| JP | 2002-178316 | * | 6/2002 | ............ B28B 1/30 |
| JP | 2004-196856 | * | 7/2004 | ............ C08J 5/18 |
| JP | 2007-069360 | * | 3/2007 | ............ B32B 27/00 |
| JP | 2011-206994 | * | 10/2011 | ............ B32B 27/30 |
| JP | 2011-206997 | | 10/2011 | |

OTHER PUBLICATIONS

International Search Report for PCT/JP2013/057176 dated Jun. 4, 2013; 2 pages.

* cited by examiner

*Primary Examiner* — Robert Harlan
(74) *Attorney, Agent, or Firm* — Schwabe Williamson & Wyatt

(57) ABSTRACT

A release film for producing a green sheet of the present invention includes a base material and a release agent layer provided at a side of a first surface of the base material. The release agent layer includes an ultraviolet curable compound (A) having three or more reactive groups selected from the group consisting of a (meth)acryloyl group, an alkenyl group and a maleimide group in one molecule thereof, a polyorganosiloxane (B) and an α-aminoalkylphenone based photopolymerization initiator (C). An arithmetic average roughness $Ra_1$ of an outer surface of the release agent layer may be different than an arithmetic average roughness $Ra_2$ of a second surface of the base material. According to the present invention, it is possible to prevent pinholes and variation in partially thickness from occurring to the green sheet.

20 Claims, 1 Drawing Sheet

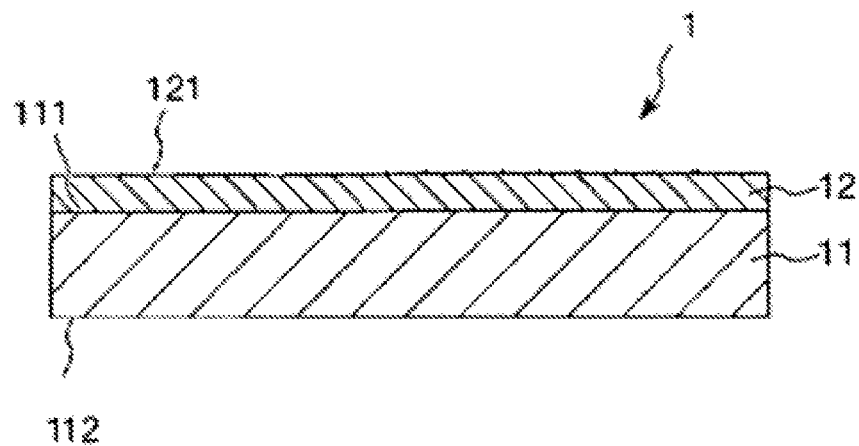

RELEASE FILM FOR PRODUCING GREEN SHEET AND METHOD OF PRODUCING RELEASE FILM FOR PRODUCING GREEN SHEET

CROSS REFERENCE TO RELATED APPLICATIONS

This application is a U.S. national phase filing of PCT Application No. PCT/JP2013/057176, filed Mar. 14, 2013, which is an international application of Japanese Patent Application No. 2012-083080, filed Mar. 30, 2012, the disclosures of which are herein incorporated by reference in their entireties.

TECHNICAL FIELD

The present invention relates to a release film for producing a green sheet and a method of producing a release film for producing a green sheet.

RELATED ART

When manufacturing a multilayer ceramic capacitor, a release film for producing a green sheet is used to form the green sheet.

The release film for producing the green sheet is usually composed of a base material and a release agent layer. The green sheet is manufactured by coating a ceramic slurry, in which ceramic particles and a binder resin are dispersed and dissolved in an organic solvent, on the release film for producing the green sheet and drying the coated ceramic slurry. By this method, it is possible to efficiently manufacture the green sheet having a uniform thickness. The green sheet thus manufactured is released from the release film for producing the green sheet and is used in manufacturing the multilayer ceramic capacitor.

During the manufacture of the green sheet as described above, the release film for producing the green sheet on which the green sheet is formed is usually stored and transported in a rolled state.

In the prior art, there has been made an attempt by which, in the release film for producing the green sheet as described above, a surface roughness (average roughness) of a surface (rear surface) of the base material opposite to a surface on which the release agent layer is formed is kept relatively high to prevent a problem of sticking (blocking) of front and rear surfaces of the release film for producing the green sheet stored in the rolled state (see, e.g., Patent Document 1).

However, in case of using the release film for producing the green sheet disclosed in Patent Document 1, it is sometimes a case that, when the release film for producing the green sheet provided with the green sheet is stored in the rolled state, a relatively rough surface shape of the rear surface of the release film for producing the green sheet is transferred to the green sheet and therefore the green sheet is partially made thin. As a result, when the capacitor is manufactured by laminating the green sheet, there may be a case where a defect is generated by short circuit.

On the other hand, if the surface roughness (average roughness) of the surface of the base material opposite to the surface on which the release agent layer is formed is made relatively low, the surface becomes too smooth and the sliding property of each front and rear surface of the release film for producing the green sheet grows poor. For that reason, there may be a case where a defect such as poor winding or blocking occurs.

The Patent Document 1 is JP-A 2003-203822

SUMMARY OF THE INVENTION

It is an object of the present invention to provide a release film for producing a green sheet capable of preventing generation of a pinhole and a partial thickness variation in a green sheet, and a method of producing the release film for producing the green sheet.

The above object is achieved by the inventions (1) to (8) set forth below.

(1) A release film for producing a green sheet, comprising:
a base material having a first surface and a second surface; and
a release agent layer provided at a side of the first surface of the base material, wherein the release agent layer is formed by irradiating an ultraviolet ray to a coated layer and curing the coated layer, and the coated layer is formed by coating a release-agent-layer-forming material on the side of the first surface of the base material, wherein the release-agent-layer-forming material includes an ultraviolet curable compound (A) having three or more reactive functional groups selected from a (meth)acryloyl group, an alkenyl group and a maleimide group in one molecule thereof, a polyorganosiloxane (B) and an α-aminoalkylphenone-based photopolymerization initiator (C),
wherein an average thickness of the release agent layer is in the range of 0.3 to 2 μm,
wherein an arithmetic average roughness $Ra_1$ of an outer surface of the release agent layer is 8 nm or less and a maximum projection height $Rp_1$ of the outer surface of the release agent layer is 50 nm or less, and
wherein an arithmetic average roughness $Ra_2$ of the second surface of the base material is in the range of 5 to 40 nm and a maximum projection height $Rp_2$ of the second surface of the base material is in the range of 60 to 500 nm.

(2) In the release film for producing the green sheet described in the above-mentioned invention (1), a solid component content of the polyorganosiloxane (B) in the release-agent-layer-forming material is in the range of 0.5 to 5 mass %.

(3) In the release film for producing the green sheet described in the above-mentioned invention (1) or (2), the polyorganosiloxane (B) is a polyorganosiloxane having a straight or branched molecular chain and includes at least one reactive functional group selected from the group consisting of a (meth)acryloyl group, an alkenyl group and a maleimide group, and
wherein the reactive functional group is bonded, at one or both of terminals of the molecular chain and a side chain of the molecular chain, to silicon atoms of the molecular chain, either directly or through a bivalent linking group.

(4) In the release film for producing the green sheet described in the above-mentioned inventions (1) to (3), the base material is formed into a laminated body having laminated layers, and at least one of the laminated layers is an antistatic layer.

(5) A method of producing a release film for producing a green sheet, comprising:
a first step of preparing a base material having a first surface and a second surface;
a second step of preparing a release-agent-layer-forming material that includes an ultraviolet curable compound (A) having three or more reactive functional groups selected from a (meth)acryloyl group, an alkenyl group and a maleimide group in one molecule thereof, a polyorganosiloxane (B) and an α-aminoalkylphenone-based photopolymerization initiator (C); and a third step of forming a release agent layer by irradiating an ultraviolet ray to a coated layer and curing the coated layer, wherein the coated layer is formed by coating the release-agent-layer-forming material on a side of the first surface of the base material, wherein an average thickness of the release agent layer is in the range of 0.3 to 2 µm, wherein an arithmetic average roughness $Ra_1$ of an outer surface of the release agent layer is 8 nm or less and a maximum projection height $Rp_1$ of the outer surface of the release agent layer is 50 nm or less, wherein an arithmetic average roughness $Ra_2$ of the second surface of the base material is in the range of 5 to 40 nm and a maximum projection height $Rp_2$ of the second surface of the base material is in the range of 60 to 500 nm.

(6) In the method described in the above-mentioned invention (5), in the third step of forming the release agent layer, the ultraviolet ray is irradiated in an air atmosphere.

(7) In the method described in the above-mentioned invention (5) or (6), a solid component content of the polyorganosiloxane (B) in the release-agent-layer-forming material is in the range of 0.5 to 5 mass %.

(8) In the method described in the above-mentioned inventions (5) to (7), in the second step of preparing the release-agent-layer-forming material, the polyorganosiloxane (B) is a polyorganosiloxane having a straight or branched molecular chain and includes at least one reactive functional group selected from the group consisting of a (meth)acryloyl group, an alkenyl group and a maleimide group, and wherein the reactive functional group is bonded, at one or both of terminals of the molecular chain and a side chain of the molecular chain, to silicon atoms of the molecular chain, either directly or through a bivalent linking group.

According to the present invention, it becomes possible to prevent the generation of the pinhole and the partial thickness variation in the green sheet. Further, the release film for producing the green sheet is capable of obtaining high smoothness of the outer surface of the release agent layer and is capable of providing superior releasability. Furthermore, it is possible to provide the method that can easily produce the release film for producing the green sheet.

BRIEF DESCRIPTION OF THE DRAWINGS

FIG. 1 is a cross sectional view of a release film for producing a green sheet according to the present invention.

DETAILED DESCRIPTION OF THE PREFERRED EMBODIMENTS

Hereinafter, the present invention will be described in detail based on a preferred embodiment.

<<Release Film for Producing Green Sheet>>

A release film for producing a green sheet according to the present invention is used in producing a green sheet.

FIG. 1 is a cross sectional view of a release film 1 for producing a green sheet according to the present invention. As shown in FIG. 1, the release film 1 for producing the green sheet includes a base material 11 having a first surface 111 and a second surface 112, and a release agent layer 12 formed on the first surface 111 of the base material 11.

The release film for producing the green sheet according to the present invention is characterized by including the base material having the second surface whose arithmetic average roughness $Ra_2$ is in the range of 5 to 40 nm and whose maximum projection height $Rp_2$ is in the range of 60 to 500 nm. Further, the release film for producing the green sheet is characterized by including the release agent layer formed into a predetermined thickness using a release-agent-layer-forming material containing specified components and having an outer surface whose arithmetic average roughness $Ra_1$ is 8 nm or less and whose maximum projection height $Rp_1$ is 50 nm or less.

If there is generated a region where a depression (depressed part) of the green sheet which may be formed by projections of the outer surface of the release agent layer coincides with a depression (depressed part) of the green sheet which may be formed by projections of the second surface of the base material, a pinhole may be formed in the region of the green sheet. However, by setting the outer surface of the release agent layer to be smoother than the second surface of the base material in this way, it is possible to prevent formation of such a pinhole in the green sheet.

Use of the present release film for producing the green sheet having the aforementioned features makes it possible to prevent the generation of the pinhole and the partial thickness variation in the green sheet. As a result, it becomes possible to form a high-quality green sheet.

In particular, even if the green sheet has an extremely small thickness (e.g., a thickness of 5 µm or less, particularly a thickness of from 0.5 µm to 2 µm), it is possible to form a high-quality green sheet which is free from the aforementioned defects. Moreover, the release film for producing the green sheet is capable of obtaining high smoothness of the outer surface of the release agent layer and is capable of providing superior releasability.

Detailed description will now be made on the respective layers that constitute the release film 1 for producing the green sheet according to the present embodiment.

<Base Material>

The base material 11 includes the first surface 111 and the second surface 112.

The base material 11 serves to apply physical strength, such as rigidity or flexibility, to the release film 1 for producing the green sheet.

The base material 11 is not particularly limited. Arbitrary one of the materials well-known in the art can be suitably selected and used as the base material 11. Examples of the base material 11 may include a film made of a plastic, e.g., polyester such as polyethyleneterephthalate or polyethylenenaphthalate, polyolefin such as polypropylene or polymethylpentene, or polycarbonate. The base material 11 may be a monolayer or may be multiple layers including two or more layers of the same kind or different kinds. Among them, a polyester film is preferred. A polyethyleneterephthalate film is particularly preferred. A biaxially-stretched polyethyleneterephthalate film is more preferred. The film made of the plastic seldom generates dust or the like during the processing or use thereof. It is therefore possible to effectively prevent generation of a coating defect of a ceramic slurry by the dust or the like.

As set forth above, the arithmetic average roughness $Ra_2$ of the second surface 112 of the base material 11 is in the range of 5 to 40 nm. In this case, when the release film 1 for producing the green sheet, in which an outer surface 121 of the release agent layer 12 is highly smooth, is wound around a paper-made, plastic-made or metal-made core member in a roll shape, an air is removed well. This makes it possible to effectively suppress a winding deviation. For that reason, there is no need to increase a winding tension. It is therefore possible to suppress deformation of the release film 1 for producing the green sheet, which is wound around a winding core, caused by the winding tension. Furthermore, it is possible to prevent generation of blocking between the front and rear surfaces of the release film 1 for producing the green sheet wound in the roll shape. Moreover, when the release film 1 for producing the green sheet provided with the green sheet is stored in an wound state, it is possible to prevent the surface shape of the second surface 112 of the base material 11 to be closely contacted with the green sheet from being transferred to the green sheet. It is also possible to prevent the generation of the pinhole and the partial thickness variation in the green sheet. As a result, it becomes possible to form the high-quality green sheet.

In contrast, if the arithmetic average roughness $Ra_2$ is less than the lower limit value, when the release film 1 for producing the green sheet not yet provided with the green sheet is wound to store the same, the air is easily trapped and the winding deviation is easy to occur. As a result, it becomes difficult to handle the release film 1 for producing the green sheet. Furthermore, the front and rear surfaces of the wound release film 1 for producing the green sheet (the second surface 112 of the base material 11 and the outer surface of the release agent layer 12) closely contact with each other. This makes it difficult to sufficiently prevent the generation of blocking. On the other hand, if the arithmetic average roughness $Ra_2$ exceeds the upper limit value, when winding the release film 1 for producing the green sheet provided with the green sheet, a shape of projection of the second surface 112 of the base material 11 to be closely contacted with the green sheet is transferred to the green sheet. For that reason, there is a fear that the pinhole or the partial thickness variation is generated in the green sheet. This makes it difficult to sufficiently maintain a smoothness of the green sheet.

As mentioned above, the arithmetic average roughness $Ra_2$ of the second surface 112 of the base material 11 is in the range of 5 to 40 nm. It is particularly preferred that the arithmetic average roughness $Ra_2$ is in the range of 10 to 30 nm. In this case, the aforementioned effects become more remarkable.

The maximum projection height $Rp_2$ of the second surface 112 of the base material 11 is in the range of 60 to 500 nm. In this case, when the release film 1 for producing the green sheet, in which the outer surface 121 of the release agent layer 12 is highly smooth, is wound around the paper-made, plastic-made or metal-made core member in the roll shape, an air is removed well. This makes it possible to effectively suppress the winding deviation. For that reason, there is no need to increase the winding tension. It is therefore possible to suppress the deformation of the release film 1 for producing the green sheet, which is wound around the winding core, caused by the winding tension. Furthermore, when unwinding the roll-shaped release film 1 for producing the green sheet, it is possible to prevent the generation of blocking between the front and rear surfaces of the release film 1 for producing the green sheet wound in the roll shape. Moreover, when the release film 1 for producing the green sheet provided with the green sheet is stored in the wound state, it is possible to prevent the surface shape of the second surface 112 of the base material 11 to be closely contacted with the green sheet from being transferred to the green sheet. It is also possible to prevent the generation of the pinhole and the partial thickness variation in the green sheet. As a result, it becomes possible to form the high-quality green sheet.

In contrast, if the maximum projection height $Rp_2$ is less than the lower limit value, when the release film 1 for producing the green sheet not yet provided with the green sheet is wound to store the same, the air is easily trapped and the winding deviation is easy to occur. As a result, it becomes difficult to handle the release film 1 for producing the green sheet. Furthermore, the base material 11 and the release agent layer 12 closely contact with each other. This makes it difficult to sufficiently prevent the generation of blocking. On the other hand, if the maximum projection height $Rp_2$ exceeds the upper limit value, when winding the release film 1 for producing the green sheet provided with the green sheet, the shape of projection of the second surface 112 of the base material 11 to be closely contacted with the green sheet is transferred to the green sheet. For that reason, there is the fear that the pinhole or the partial thickness variation is generated in the green sheet. This makes it difficult to sufficiently maintain the smoothness of the green sheet.

As mentioned above, the maximum projection height $Rp_2$ of the second surface 112 of the base material 11 is in the range of 60 to 500 nm. It is more preferred that the maximum projection height $Rp_2$ is in the range of 80 to 400 nm. It is particularly preferred that the maximum projection height $Rp_2$ is 100 to 300 nm. In this case, the aforementioned effects become more remarkable.

An arithmetic average roughness $Ra_0$ of the first surface 111 of the base material 11 is preferably in the range of 2 to 80 nm and more preferably in the range of 5 to 50 nm. As will be described later, a smoothened release agent layer 12 that fills spaces of depressed parts and slant surfaces of raised parts of the first surface 111 of the base material 11 is formed on the first surface 111 of the base material 11. Therefore, if the arithmetic average roughness $Ra_0$ is set to fall within the above range, a smoothening action becomes particularly remarkable.

A maximum projection height $Rp_0$ of the first surface 111 of the base material 11 is preferably in the range of 10 to 700 nm and more preferably in the range of 20 to 500 nm. As will be described later, the smoothened release agent layer 12 that fills the spaces of the depressed parts and the slant surfaces of the raised parts of the first surface 111 of the base material 11 is formed on the first surface 111 of the base material 11. Therefore, if the maximum projection height $Rp_0$ is set to fall within the above range, the smoothening action becomes particularly remarkable.

An average thickness of the base material 11 is preferably in the range of 10 to 300 μm and more preferably in the range of 15 to 200 μm. In this case, a resistance to tear or breaking can be made particularly superior while keeping proper the flexibility of the release film 1 for producing the green sheet.

<Release Agent Layer>

The release agent layer 12 is formed on the first surface 111 of the base material 11. The release agent layer 12 serves to apply the releasability to the release film 1 for producing the green sheet.

The release agent layer 12 is a layer which is formed by irradiating an ultraviolet ray to the release-agent-layer-forming material containing the specified components and curing the release-agent-layer-forming material.

The release-agent-layer-forming material contains an ultraviolet curable compound (A) having, in one molecule, three or more reactive functional groups selected from a (meth)acryloyl group, an alkenyl group and a maleimide group, a polyorganosiloxane (B) and an α-aminoalkylphenone-based photopolymerization initiator (C). Use of this release-agent-layer-forming material makes it possible to keep particularly superior the curability of the release agent layer 12 at the forming itself and the releasability against the green sheet.

The respective components of the release-agent-layer-forming material will now be described in detail.

[Ultraviolet Curable Compound (A)]

The ultraviolet curable compound (A) is a component that makes contribution to the formation of the release agent layer 12 by curing.

The ultraviolet curable compound (A) has, in one molecule, the three or more reactive functional groups selected from the (meth)acryloyl group, the alkenyl group and the maleimide group. Thus, even if the release agent layer 12 has a thickness at which the curability is hardly obtainable due to oxygen inhibition, it is possible to obtain superior curability, superior solvent resistance and superior releasability. In contrast, if the reactive functional groups selected from the (meth)acryloyl group, the alkenyl group and the maleimide group are less than three in one molecule, the curability is lowered. It is therefore difficult to form the release agent layer 12. Examples of the alkenyl group may include a group having a carbon number of 2 to 10 such as a vinyl group, an allyl group, a propenyl group and a hexenyl group.

In the ultraviolet curable compound (A), a content of the reactive functional groups selected from the (meth)acryloyl group, the alkenyl group and the maleimide group is preferably an equivalent of 10 or more per 1 kg of the ultraviolet curable compound (A). In this case, even when the release-agent-layer-forming material is coated as a thin film on the first surface 111, it is possible to keep particularly superior the curability of the ultraviolet curable compound (A).

Specific examples of the ultraviolet curable compound (A) may include a multifunctional (meth)acrylate such as dipentaerythritol tri(meth)acrylate, dipentaerythritol tetra(meth)acrylate, dipentaerythritol penta(meth)acrylate, dipentaerythritol hexa(meth)acrylate, pentaerythritol tri(meth)acrylate or pentaerythritol tetra(meth)acrylate. Among them, it is preferable to use at least one multifunctional acrylate selected from the group consisting of dipentaerythritol triacrylate, dipentaerythritol tetraacrylate, dipentaerythritol pentaacrylate, dipentaerythritol hexaacrylate, pentaerythritol triacrylate, and pentaerythritol tetraacrylate. In this case, even when the release-agent-layer-forming material is coated as the thin film on the first surface 111, it is possible to keep particularly superior the curability of the ultraviolet curable compound (A).

A solid component content (content ratio in the total solid components except a solvent) of the ultraviolet curable compound (A) in the release-agent-layer-forming material is preferably in the range of 65 to 98.5 mass % and more preferably in the range of 71 to 94 mass %.

[Polyorganosiloxane (B)]

The polyorganosiloxane (B) is a component for developing the releasability in the release agent layer 12. Examples of the polyorganosiloxane (B) may include the polyorganosiloxane having a straight or branched molecular chain. Particularly, it is preferable to use a denatured polyorganosiloxane in which at least one reactive functional group selected from the group consisting of a (meth)acryloyl group, an alkenyl group and a maleimide group is bonded, at one or both of terminals of the molecular chain and a side chain of the molecular chain, to silicon atoms of the molecular chain, either directly or through a bivalent linking group. Examples of the alkenyl group may include a group having a carbon number of 2 to 10 such as a vinyl group, an allyl group, a propenyl group and a hexenyl group. Examples of the bivalent linking group may include an alkylene group, an alkyleneoxy group, an oxy group, an imino group, a carbonyl group and the combinations thereof. The carbon number of the bivalent linking group is preferably in the range of 1 to 30 and more preferably in the range of 1 to 10. Depending on the necessity, two or more kinds of substances may be combined and used as the polyorganosiloxane (B).

The denatured polyorganosiloxane substituted by the reactive functional group is incorporated into and fixed to a cross-linking structure of a cured body of the ultraviolet curable compound (A) when the ultraviolet curable compound (A) is cured by the irradiation of the ultraviolet ray. This makes it possible to prevent the polyorganosiloxane as one component of the release agent layer 12 from migrating to and transferring to the green sheet formed on the outer surface 121 of the release agent layer 12.

Examples of an organic group other than the reactive functional group that constitutes the polyorganosiloxane (B) may include a monovalent hydrocarbon group that does not have an aliphatic unsaturated bond. The organic group may be a plurality of monovalent hydrocarbon groups in which the groups may be the same kind or different kinds. The carbon number of the hydrocarbon group is preferably in the range of 1 to 12 and more preferably in the range of 1 to 10. Specific examples of the hydrocarbon group may include an alkyl group, such as a methyl group, an ethyl group or a propyl group, and an aryl group, such as a phenyl group or a tolyl group.

Particularly, it is preferred that 80 mol % or more of the organic group other than the reactive functional group that constitutes the polyorganosiloxane (B) is the methyl group. In this case, the releasability of the release agent layer 12 can be kept particularly superior.

A solid component content of the polyorganosiloxane (B) in the release-agent-layer-forming material is preferably in the range of 0.5 to 5 mass % and more preferably in the range of 0.7 to 4 mass %. In this case, the ceramic slurry can be coated on the base material 11 without repelling the ceramic slurry. This makes it possible to keep particularly superior the releasability of the release film 1 for producing the green sheet.

In contrast, if the solid component content of the polyorganosiloxane (B) in the release-agent-layer-forming material is less than the lower limit value, there is a fear that the release agent layer 12 thus formed cannot show sufficient releasability. On the other hand, if the solid component content of the polyorganosiloxane (B) in the release-agent-layer-forming material exceeds the upper limit value, there is a fear that, when the ceramic slurry is coated on the outer surface 121 of the release agent layer 12, the ceramic slurry is repelled with ease. Furthermore, there is sometimes a case that the release agent layer 12 is hardly cured and sufficient releasability is not obtained.

Assuming that a blending amount of the ultraviolet curable compound (A) is A mass parts and a blending amount of the polyorganosiloxane (B) is B mass parts, a mass ratio B/A is preferably in the range of 0.7/99.3 to 5/95 and more preferably in the range of 1/99 to 4.5/95.5. In this case, the aforementioned effects become more remarkable.

[Photopolymerization Initiator (C)]

The α-aminoalkylphenone-based photopolymerization initiator (C) is a component for improving the curability of the release agent layer 12.

Examples of the α-aminoalkylphenone-based photopolymerization initiator (C) may include 2-methyl-1[4-(methylthio)phenyl]-2-morpholinopropane-1-one, 2-benzyl-2-dimethylamino-1-(4-morpholinophenyl)-butanone-1, and 2-(dimethylamino)-2-[(4-methylphenyl)methyl]-1-[4-(4-morpholinyl)phenyl]-1-butanone. In this case, it is possible to obtain superior curability, superior solvent resistance and superior releasability.

A solid component content of the photopolymerization initiator (C) in the release-agent-layer-forming material is preferably in the range of 1 to 20 mass % and more preferably in the range of 3 to 15 mass %. In this case, even if the release agent layer 12 has a thickness at which curability is hardly obtainable due to oxygen inhibition, it is possible to obtain the superior curability, the superior solvent resistance and the superior releasability.

The release-agent-layer-forming material may contain other components than the aforementioned components. For instance, the release-agent-layer-forming material may contain a sensitizer, an antistatic agent, a hardening agent, a reactive monomer, and so forth.

As the sensitizer, it may be possible to use, e.g., 2,4-diethyl thioxanthone or isopropyl thioxanthone. This makes it possible to enhance reactivity.

A solid component content of other components in the release-agent-layer-forming material is preferably in the range of 0 to 10 mass %.

An average thickness of the release agent layer 12 is preferably in the range of 0.3 to 2 μm. If the average thickness of the release agent layer 12 is less than the lower limit value, the smoothness of the outer surface 121 of the release agent layer 12 becomes insufficient. As a result, there is a fear that, when the green sheet is molded on the outer surface 121 of the release agent layer 12, the pinhole or the partial thickness variation is generated in the green sheet. On the other hand, if the average thickness of the release agent layer 12 exceeds the upper limit value, a curl is easily generated in the release film 1 for producing the green sheet due to shrinkage by curing the release agent layer 12. Furthermore, the blocking is easily generated between the front and rear surfaces of the wound release film 1 for producing the green sheet (between the second surface 112 of the base material 11 and the outer surface of the release agent layer 12). For that reason, there is a fear that a trouble is generated in unwinding the release film 1 for producing the green sheet or an electric charge amount is increased when unwinding the release film 1 for producing the green sheet.

The arithmetic average roughness $Ra_1$ of the outer surface 121 of the release agent layer 12 is 8 nm or less. Thus, when the green sheet is molded on the outer surface 121 of the release agent layer 12, it is possible to reliably prevent the generation of the pinhole and the partial thickness variation in the green sheet. This makes it possible to keep highly smooth the surface of the green sheet.

The maximum projection height $Rp_1$ of the outer surface 121 of the release agent layer 12 is 50 nm or less. Thus, when the green sheet is molded on the outer surface 121 of the release agent layer 12, it is possible to reliably prevent the generation of the pinhole and the partial thickness variation in the green sheet. This makes it possible to keep highly smooth the surface of the green sheet.

<<Method of Producing Release Film for Producing Green Sheet>>

Next, description will be made on one preferred embodiment of a method of producing the release film 1 for producing the green sheet described above.

The method of the present embodiment includes a first step for preparing the base material 11, a second step for preparing the release-agent-layer-forming material, and a third step for forming the release agent layer 12 by forming a coated layer by coating the release-agent-layer-forming material on the first surface 111 of the base material 11 and drying the release-agent-layer-forming material, and by irradiating the ultraviolet ray to the coated layer and curing the coated layer.

The respective steps will now be described in detail.

<First Step>

First, the base material 11 is prepared.

The first surface 111 of the base material 11 can be subjected to a surface treatment using an oxidation method or a plasma treatment. This makes it possible to keep superior adhesion of the base material 11 and the release agent layer 12 formed on the first surface 111 of the base material 11.

Examples of the oxidation method may include a corona discharge treatment, a plasma discharge treatment, a chromium oxidation treatment (wet-type), a flame treatment, a hot air treatment, an ozone treatment and an ultraviolet irradiation treatment. These surface treatment methods are properly selected depending on the kind of the base material 11. The corona discharge treatment method is generally preferred from the aspect of the effect and the operability.

<Second Step>

Next, the release-agent-layer-forming material is obtained by dissolving or dispersing such components as the ultraviolet curable compound (A), the polyorganosiloxane (B) and the photopolymerization initiator (C) in the solvent.

Examples of the solvent may include methanol, ethanol, toluene, ethyl acetate, xylene, methyl ethyl ketone, methyl butyl ketone, isopropyl alcohol and the like.

<Third Step>

Next, the coated layer is obtained by coating the release-agent-layer-forming material on the first surface 111 of the base material 11 and drying the release-agent-layer-forming material. Between the coating process and the drying process, the release-agent-layer-forming material fills the spaces of depressed parts and the slant surfaces of raised parts of the first surface 111, thereby forming a smoothened coated layer. A smoothened release agent layer 12 is formed by irradiating the ultraviolet ray to the coated layer thus obtained and curing the coated layer. At this time, the irradiation amount of ultraviolet rays is set such that an accumulated amount of light is preferably in the range of 50 to 1000 $mJ/cm^2$ and more preferably in the range of 100 to 500 $mJ/cm^2$. Thus, the release film 1 for producing the green sheet is obtained.

Examples of the coating method of the release-agent-layer-forming material may include a gravure coating method, a bar coating method, a spray coating method, a spin coating method, a knife coating method, a roll coating method, a die coating method and the like.

In case where the coated layer is cured by the irradiation of the ultraviolet ray, radicals generated by a photopolymerization initiator are usually deactivated under the influence of oxygen. That is to say, under the presence of oxygen, the coated layer is inhibited from curing. The influence of oxygen becomes conspicuous as the coated layer grows thinner. Accordingly, it is typical that the ultraviolet curing of the coated layer is performed under a nitrogen atmosphere. For that reason, large-scale facilities are needed.

In contrast, the release-agent-layer-forming material employed in the present invention utilizes the ultraviolet curable compound (A) which is high in curability and the photopolymerization initiator (C) which is less susceptible to oxygen inhibition. Thus, superior curability can be obtained even under an air atmosphere.

In the release film 1 for producing the green sheet described above, a component deriving from the polyorganosiloxane (B) is segregated near the outer surface 121 of the release agent layer 12. The reason for occurrence of this segregation is presumed to be that, due to the use of the polyorganosiloxane (B) differing in a molecular structure, polarity and a molecular weight from the ultraviolet curable compound (A), the polyorganosiloxane (B) is pushed up toward the outer surface 121 while the coated layer of the release-agent-layer-forming material is cured.

According to the steps described above, it is possible to easily produce the release film 1 for producing the green sheet that can be used in producing the green sheet which suppresses the generation of the pinhole and the partial thickness variation. Furthermore, it is possible to produce the release film 1 for producing the green sheet which is superior in releasability and curability.

While the present invention has been described in detail based on the preferred embodiment, the present invention is not limited to the aforementioned embodiment.

For example, in the aforementioned embodiment, the base material 11 has been described as being formed of a single layer. However, the present invention is not limited thereto. For instance, the base material 11 may not be formed of the single layer but may be formed of a laminated body having two or more layers. In case where the base material 11 is the laminated body, for example, an outermost one of laminated layers, which adjoins the release agent layer 12, may serve as a layer that enhances adhesion.

Furthermore, for example, at least one of laminated layers may serve as an antistatic layer. Specific examples of the base material 11 may include a laminated body of a plastic-made film and an antistatic layer. The antistatic layer of the base material 11 formed of the laminated body may be positioned at the same side as the release agent layer 12 of the release film 1 for producing the green sheet or may be positioned at the opposite side of the release film 1 for producing the green sheet from the release agent layer 12. Use of the base material 11 formed of the laminated body having the antistatic layer makes it possible to effectively prevent electrification when unwinding the release film 1 for producing the green sheet not yet provided with the green sheet.

It is preferable that the antistatic layer is, e.g., a resin layer composed of an antistatic-layer-forming composition which contains a conductive polymer and a resin. An arbitrary one selected from the conductive polymers well-known in the art can be used as the conductive polymer. Among them, it is preferable to use a polythiophene-based conductive polymer, a polyaniline-based conductive polymer or a polypyrrole-based conductive polymer. Examples of the polythiophene-based conductive polymer may include polythiophene, poly(3-alkylthiophene), poly(3-thiophene-β-ethanesulfonic acid), and a mixture of polyalkylene dioxythiophene and polystyrene sulfonate. Examples of the polyalkylene dioxythiophene may include polyethylene dioxythiophene, polypropylene dioxythiophene, and poly(ethylene/propylene)dioxythiophene. Examples of the polyaniline-based conductive polymer may include polyaniline, polymethylaniline, and polymethoxyaniline. Examples of the polypyrrole-based conductive polymer may include polypyrrole, poly(3-methylpyrrole), and poly(3-octylpyrrole). These conductive polymer compounds may be used either independently or in combination of two or more kinds thereof. Furthermore, it is preferred that the resin used in the antistatic-layer-forming composition is mainly composed of at least one resin selected from the group consisting of a polyester resin, an urethane resin and an acryl resin. These resins may be a thermosetting compound or an ultraviolet curable compound.

A content of the conductive polymer in the antistatic-layer-forming composition is preferably in the range of 0.1 to 50 mass % and more preferably in the range of 0.3 to 30 mass % in terms of solid content conversion. If the content of the conductive polymer falls within the above range, a sufficient antistatic property is obtained and strength of the antistatic layer formed of the antistatic-layer-forming composition becomes sufficient.

A thickness of the antistatic layer is in the range of 30 to 290 nm and preferably in the range of 30 to 250 nm. If the thickness of the antistatic layer falls within the above range, a sufficient film formation property is obtained and a trouble such as repellence or the like is hard to occur.

A surface resistivity of the release agent layer 12 of the release film 1 for producing the green sheet that makes use of the base material 11 formed of the laminated body having the antistatic layer is preferably in the range of $1 \times 10^6$ to $1 \times 10^{12} \Omega/\square$ and more preferably in the range of $1 \times 10^7$ to $1 \times 10^{10} \Omega/\square$.

The method of producing the release film for producing the green sheet according to the present invention is not limited to the aforementioned method. If necessary, an arbitrary step may be added.

EXAMPLES

Next, description will be made on specific examples of the release film for producing the green sheet according to the present invention.

[1] Production of Release Film for Producing Green Sheet

Example 1

First, a biaxially-stretched polyethyleneterephthalate film [having a thickness of 31 μm, an arithmetic average roughness $Ra_0$ of a first surface of 29 nm, a maximum projection height $Rp_0$ of the first surface of 257 nm, an arithmetic average roughness $Ra_2$ of a second surface of 29 nm, and a maximum projection height $Rp_2$ of the second surface of 257 nm] was prepared as a base material.

Next, a release-agent-layer-forming material was prepared. 94 mass parts of dipentaerythritol hexaacrylate [having a solid content of 100 mass %] as an ultraviolet curable compound (A), 1 mass part of polydimethyl siloxane containing acryloyl groups [produced by Shin-Etsu Chemical Co., Ltd. and sold under a trade name "X-22-164A", and having a solid content of 100 mass %] as a polyorganosiloxane (B), and 5 mass parts of an α-aminoalkylphenone-based photopolymerization initiator [2-methyl-1[4-(methylthio)phenyl]-2-morpholinopropane-1-one produced by BASF Corporation and sold under a trade name "IRGACURE907", and having a solid content of 100 mass %] as an α-aminoalkylphenone-based photopolymerization initiator (C), were diluted with a mixed solvent of isopropyl alcohol and methyl ethyl ketone (having a mass ratio of 3/1). Thus, a release-agent-layer-forming material having a solid content of 20 mass % was obtained.

The release-agent-layer-forming material thus obtained was coated on the first surface of the base material with a bar coater. A coated layer was obtained by drying the release-agent-layer-forming material at 80° C. for one minute. A release agent layer (having a thickness of 1 μm) was formed by irradiating an ultraviolet ray to the coated layer thus obtained (in an accumulated amount of light of 250 mJ/cm$^2$). Consequently, a release film for producing a green sheet was obtained.

Example 2

A release film for producing a green sheet was produced in the same manner as in Example 1 except that the ultraviolet curable compound (A) was changed to pentaerythritol tetraacrylate [having a solid content of 100 mass %].

Example 3

A release film for producing a green sheet was produced in the same manner as in Example 1 except that the thickness of the release agent layer was changed to 0.5 μm.

Example 4

A release film for producing a green sheet was produced in the same manner as in Example 1 except that the thickness of the release agent layer was changed to 1.9 μm.

Example 5

A release film for producing a green sheet was produced in the same manner as in Example 1 except that the 94 mass parts of the dipentaerythritol hexaacrylate [having the solid content of 100 mass %] as the ultraviolet curable compound (A) were changed to 93 mass parts and that the 1 mass part of the polydimethyl siloxane containing the acryloyl groups [produced by Shin-Etsu Chemical Co., Ltd. and sold under a trade name "X-22-164A", and having the solid content of 100 mass %] as the polyorganosiloxane (B) was changed to 2 mass parts.

Example 6

A release film for producing a green sheet was produced in the same manner as in Example 1 except that the 94 mass parts of the dipentaerythritol hexaacrylate [having the solid content of 100 mass %] as the ultraviolet curable compound (A) were changed to 91 mass parts and that the 1 mass part of polydimethyl siloxane containing the acryloyl groups [produced by Shin-Etsu Chemical Co., Ltd. and sold under the trade name "X-22-164A", and having the solid content of 100 mass %] as the polyorganosiloxane (B) was changed to 4 mass parts.

Example 7

A release film for producing a green sheet was produced in the same manner as in Example 1 except that the base material was changed to a biaxially-stretched polyethyleneterephthalate film [having a thickness of 38 μm, an arithmetic average roughness $Ra_0$ of a first surface of 35 nm, a maximum projection height $Rp_0$ of the first surface of 471 nm, an arithmetic average roughness $Ra_2$ of a second surface of 35 nm, and a maximum projection height $Rp_2$ of the second surface of 471 nm].

Example 8

A release film for producing a green sheet was produced in the same manner as in Example 1 except that the base material was changed to a biaxially-stretched polyethyleneterephthalate film [having a thickness of 38 μm, an arithmetic average roughness $Ra_0$ of a first surface of 15 nm, a maximum projection height $Rp_0$ of the first surface of 98 nm, an arithmetic average roughness $Ra_2$ of a second surface of 15 nm, and a maximum projection height $Rp_2$ of the second surface of 98 nm].

Example 9

First, an antistatic-layer-forming composition [in which a resin composition (produced by CHUKYO YUSHI CO., LTD. and sold under a trade name "P-973", and having a solid content of 10 mass %) obtained by mixing in the range of 0.1 to 1.0 mass % of polyethylene dioxythiophene (PEDOT) and polystyrene sulfonate (PSS) as a conductive polymer with a mixed resin emulsion containing copolyester and polyurethane was diluted by a mixed liquid of isopropyl alcohol and purified water (having a mixture ratio of 1:1) so as to have a solid content of 1.0 mass %] was uniformly coated on a biaxially-stretched polyethyleneterephthalate film having a thickness of 31 μm such that, when dried, the antistatic-layer-forming composition has a thickness of 0.05 μm. The antistatic-layer-forming composition thus coated was dried at 120° C. for one minute. Thus, a base material [having a thickness of 31.05 μm, an arithmetic average roughness $Ra_0$ of a first surface (a surface existing at the same side as an antistatic layer) of 29 nm, a maximum projection height $Rp_0$ of the first surface (the surface existing at the same side as the antistatic layer) of 266 nm, an arithmetic average roughness $Ra_2$ of a second surface of 29 nm, and a maximum projection height $Rp_2$ of the second surface of 257 nm] formed of a laminated body of the biaxially-stretched polyethyleneterephthalate film having the thickness of 31 μm and the antistatic layer having the thickness of 0.05 μm was produced.

Next, a release-agent-layer-forming material was prepared. 94 mass parts of dipentaerythritol hexaacrylate [having a solid content of 100 mass %] as an ultraviolet curable compound (A), 1 mass part of polydimethyl siloxane containing a polyether-modified acryloyl group [produced by BYK-Chemie GmbH and sold under a trade name "BYK-3500", and having a solid content of 100 mass %] as a polyorganosiloxane (B), and 5 mass parts of an α-aminoalkylphenone-based photopolymerization initiator [2-methyl-1[4-(methylthio)phenyl]-2-morpholinopropane-1-one produced by BASF Corporation and sold under a trade name "IRGACURE907", and having a solid content of 100 mass %] as an α-aminoalkylphenone-based photopolymerization initiator (C), were diluted with a mixed solvent of isopropyl alcohol and methyl ethyl ketone (having a mass ratio of 3/1). Thus, a release-agent-layer-forming material having a solid content of 20 mass % was obtained.

The release-agent-layer-forming material thus obtained was coated on the first surface of the base material of the laminated body with a bar coater. A coated layer was obtained by drying the release-agent-layer-forming material at 80° C. for one minute. A release agent layer (having a thickness of 1 μm) was formed by irradiating an ultraviolet ray to the coated layer thus obtained (in an accumulated amount of light of 250 mJ/cm$^2$). Consequently, a release film for producing a green sheet was obtained.

The release film for producing the green sheet thus obtained was cut into a size of 100 mm×100 mm and humidity-controlled for 24 hours at a temperature of 23° C. and at a humidity of 50%. Thereafter, a resistivity of the surface existing at a side of the release agent layer was measured in accordance with JIS K6911 (1995) using "R12704 Resistivity Chamber" made by Advantest Corporation and "Digital Electrometer R8252" made by Advantest Corporation. As a result, it was found that the resistivity of the surface existing at the side of the release agent layer was $10^9 \Omega/\square$.

The release film for producing the green sheet thus obtained was wound in a roll shape with a width of 400 mm and a length of 5000 m. The release film roll was unwound by a cutting machine at a speed of 100 m/min. An electric charge amount (unwinding electric charge amount) on the surface of the release agent layer of the just-unwound release film was measured using "Explosion-Proof Type Static Electricity Potential Measuring Device KSD-0108" made by KASUGA ELECTRIC WORKS LTD. As a result, it was found that the electric charge amount was 7 kV.

Example 10

First, an antistatic-layer-forming composition [which was obtained by mixing 125 mass parts of a solution containing 75 mass parts of an acryl-based monomer containing dipentaerythritol hexaacrylate, pentaerythritol hexaacrylate and N-vinyl pyrrolidone in a mass ratio of 45:20:10, 20 mass parts of butyl acetate and 30 mass parts of isopropanol, 15.5 mass parts of an aqueous solution containing 1.3 mass % of polyethylene dioxythiophene/polystyrene sulfonate (PEDOT/PSS) as a conductive polymer, and 0.2 mass part of α-hydroxy cyclohexyl phenyl methanone as a photopolymerization initiator, and then diluting the mixture with isopropanol such that a sum amount of the acryl-based monomer and the conductive polymer became equal to 1 mass %] was uniformly coated with a Mayer bar on a biaxially-stretched polyethyleneterephthalate film having a thickness of 31 μm such that, when dried, the antistatic-layer-forming composition has a thickness of 0.05 μm. The antistatic-layer-forming composition was heated for one minute at 55° C. and was irradiated with an ultraviolet ray (in an accumulated amount of light of 250 mJ/cm$^2$). Thus, a base material [having a thickness of 31.05 μm, an arithmetic average roughness Ra$_0$ of a first surface of 29 nm, a maximum projection height Rp$_0$ of the first surface of 257 nm, an arithmetic average roughness Ra$_2$ of a second surface (a surface existing at the side of an antistatic layer) of 28 nm, and a maximum projection height Rp$_2$ of the second surface (the surface existing at the side of the antistatic layer) of 263 nm] formed of a laminated body of the biaxially-stretched polyethyleneterephthalate film having the thickness of 31 μm and the antistatic layer having the thickness of 0.05 μm was produced.

Next, a release-agent-layer-forming material was prepared in the same manner as in Example 1. The release-agent-layer-forming material thus obtained was coated with a bar coater on the first surface of the base material formed of the laminated body. A coated layer was obtained by drying the release-agent-layer-forming material at 80° C. for one minute. A release agent layer (having a thickness of 1 μm) was formed by irradiating the ultraviolet ray to the coated layer thus obtained (in an accumulated amount of light of 250 mJ/cm$^2$). Consequently, a release film for producing a green sheet was obtained.

The release film for producing the green sheet thus obtained was cut into a size of 100 mm×100 mm and was humidity-controlled for 24 hours at a temperature of 23° C. and at a humidity of 50%. Thereafter, a resistivity of the surface existing at a side of the release agent layer was measured in accordance with JIS K6911 (1995) using "R12704 Resistivity Chamber" made by Advantest Corporation and "Digital Electrometer R8252" made by Advantest Corporation. As a result, it was found that the resistivity of the surface existing at the side of the release agent layer was $10^9 \Omega/\square$.

The release film for producing the green sheet thus obtained was wound in a roll shape with a width of 400 mm and a length of 5000 m. The release film roll was unwound by a cutting machine at a speed of 100 m/min. An electric charge amount (unwinding electric charge amount) on the surface of the release agent layer of the just-unwound release film was measured using "Explosion-Proof Type Static Electricity Potential Measuring Device KSD-0108" made by KASUGA ELECTRIC WORKS LTD. As a result, it was found that the electric charge amount was 6 kV.

Comparative Example 1

A release film for producing a green sheet was produced in the same manner as in Example 1 except that the photopolymerization initiator was changed to an α-hydroxyalkylphenone-based photopolymerization initiator [1-hydroxy-cyclohexyl-phenyl-ketone produced by BASF Corporation and sold under a trade name "IRGACURE184", and having a solid content of 100 mass %].

Comparative Example 2

A release film for producing a green sheet was produced in the same manner as in Example 1 except that the photopolymerization initiator was changed to an α-hydroxyalkylphenone-based photopolymerization initiator [2-hydroxy-1-{4-[4-(2-hydroxy-2-methyl-propionyl)-benzyl]phenyl}-2-methyl-propane-1-one produced by BASF Corporation and sold under a trade name "IRGACURE127", and having a solid content of 100 mass %].

Comparative Example 3

A release film for producing a green sheet was produced in the same manner as in Example 1 except that the ultraviolet curable compound was changed to 1,9-nonanediol diacrylate (having a solid content of 100 mass %).

Comparative Example 4

A release film for producing a green sheet was produced in the same manner as in Example 1 except that the ultraviolet curable compound was changed to 1,10-decanediol diacrylate (having a solid content of 100 mass %).

Comparative Example 5

A release film for producing a green sheet was produced in the same manner as in Example 1 except that the 94 mass parts of the dipentaerythritol hexaacrylate [having the solid content of 100 mass %] as the ultraviolet curable compound (A) were changed to 95 mass parts and that the polydimethyl siloxane containing the acryloyl group as the polyorganosiloxane (B) was not added.

Comparative Example 6

A release film for producing a green sheet was produced in the same manner as in Example 1 except that the thickness of the release agent layer was changed to 0.2 μm.

Comparative Example 7

A release film for producing a green sheet was produced in the same manner as in Example 1 except that the base material was changed to a biaxially-stretched polyethylene-terephthalate film [having a thickness of 38 μm, an arithmetic average roughness $Ra_0$ of a first surface of 42 nm, a maximum projection height $Rp_0$ of the first surface of 619 nm, an arithmetic average roughness $Ra_2$ of a second surface of 42 nm, and a maximum projection height $Rp_2$ of the second surface of 619 nm].

Comparative Example 8

A release film for producing a green sheet was produced in the same manner as in Example 1 except that the base material was changed to a biaxially-stretched polyethylene-terephthalate film [having a thickness of 38 μm, an arithmetic average roughness $Ra_0$ of a first surface of 15 nm, a maximum projection height $Rp_0$ of the first surface of 105 nm, an arithmetic average roughness $Ra_2$ of a second surface of 3 nm, and a maximum projection height $Rp_2$ of the second surface of 15 nm].

These results are shown in Table 1.

The thicknesses of the release agent layers of the respective Examples and the respective Comparative Examples were measured with a reflection-type film thickness meter "F20" made by Filmetrics Co, Ltd. An arithmetic average roughness $Ra_1$ of an outer surface of the release agent layer, a maximum projection height $Rp_1$ of the outer surface of the release agent layer, the arithmetic average roughness $Ra_2$ of the second surface of the base material and the maximum projection height $Rp_2$ of the second surface of the base material were measured in the following manner. First, a double-side tape was attached to a glass plate. Then, each of the release films for producing the green sheets obtained in the respective Examples and the respective Comparative Examples was fixed to the double-side tape such that the surface opposite to the surface to be measured was positioned at a side of the glass plate. Subsequently, the arithmetic average roughnesses $Ra_1$ and $Ra_2$ and the maximum projection heights $Rp_1$ and $Rp_2$ were measured in accordance with JIS B0601-1994 using a surface roughness meter "SV3000S4" (probe type) made by Mitsutoyo Corporation.

In Table 1 shown below, the dipentaerythritol hexaacrylate as the ultraviolet curable compound is indicated by A1. The pentaerythritol tetraacrylate as the ultraviolet curable compound is indicated by A2. The 1,9-nonanediol diacrylate as the ultraviolet curable compound is indicated by A3. The 1,10-decanediol diacrylate as the ultraviolet curable compound is indicated by A4. The Polydimethyl siloxane containing the acryloyl group [produced by Shin-Etsu Chemical Co., Ltd. and sold under a trade name "X-22-164A"] as the polyorganosiloxane is indicated by B1. The Polydimethyl siloxane containing the polyether-modified acryloyl group [produced by BYK-Chemie GmbH and sold under a trade name "BYK-3500"] as the polyorganosiloxane is indicated by B2. The α-aminoalkylphenone-based photopolymerization initiator [2-methyl-1[4-(methylthio)phenyl]-2-morpholinopropane-1-one produced by BASF Corporation and sold under a trade name "IRGACURE907"] as the photopolymerization initiator is indicated by C1. The α-hydroxyalkylphenone-based photopolymerization initiator [1-hydroxy-cyclohexyl-phenyl-ketone produced by BASF Corporation and sold under a trade name "IRGACURE184"] as the photopolymerization initiator is indicated by C2. The α-hydroxyalkylphenone-based photopolymerization initiator [2-hydroxy-1-{4-[4-(2-hydroxy-2-methyl-propionyl)-benzyl]phenyl}-2-methyl-propane-1-one produced by BASF Corporation and sold under a trade name "IRGACURE127"] as the photopolymerization initiator is indicated by C3.

TABLE 1

| | Base Material | | Release Agent Layer | | | | | | | | |
|---|---|---|---|---|---|---|---|---|---|---|---|
| | Surface Roughness of Second Surface | | Ultraviolet Curable Compound | | | Polyorganosiloxane | | Photopolymerization initiator | | | Surface Roughness of Outer Surface | |
| | Arithmetic Average Roughness $Ra_2$ [nm] | Maximum Projection Height $Rp_2$ [nm] | Kind | Blending Amount [Mass Parts] | Reactive Functional Group [Equivalent/kg] | Kind | Blending Amount [Mass Parts] | Kind | Blending Amount [Mass Parts] | Thickness [μm] | Arithmetic Average Roughness $Ra_1$ [nm] | Maximum Projection Height $Rp_1$ [nm] |
| Example 1 | 29 | 257 | A1 | 94 | 10.4 | B1 | 1 | C1 | 5 | 1 | 3 | 17 |
| Example 2 | 29 | 257 | A2 | 94 | 11.4 | B1 | 1 | C1 | 5 | 1 | 3 | 17 |
| Example 3 | 29 | 257 | A1 | 94 | 10.4 | B1 | 1 | C1 | 5 | 0.5 | 5 | 49 |
| Example 4 | 29 | 257 | A1 | 94 | 10.4 | B1 | 1 | C1 | 5 | 1.9 | 3 | 15 |
| Example 5 | 29 | 257 | A1 | 93 | 10.4 | B1 | 2 | C1 | 5 | 1 | 3 | 17 |
| Example 6 | 29 | 257 | A1 | 91 | 10.4 | B1 | 4 | C1 | 5 | 1 | 3 | 17 |
| Example 7 | 35 | 471 | A1 | 94 | 10.4 | B1 | 1 | C1 | 5 | 1 | 4 | 28 |
| Example 8 | 15 | 98 | A1 | 94 | 10.4 | B1 | 1 | C1 | 5 | 1 | 2 | 9 |
| Example 9 | 29 | 257 | A1 | 94 | 10.4 | B2 | 1 | C1 | 5 | 1 | 3 | 18 |
| Example 10 | 28 | 263 | A1 | 94 | 10.4 | B1 | 1 | C1 | 5 | 1 | 3 | 17 |
| Comparative Example 1 | 29 | 257 | A1 | 94 | 10.4 | B1 | 1 | C2 | 5 | 1 | 3 | 14 |
| Comparative Example 2 | 29 | 257 | A1 | 94 | 10.4 | B1 | 1 | C3 | 5 | 1 | 3 | 14 |
| Comparative Example 3 | 29 | 257 | A3 | 94 | 7.5 | B1 | 1 | C1 | 5 | 1 | 3 | 14 |
| Comparative Example 4 | 29 | 257 | A4 | 94 | 7.1 | B1 | 1 | C1 | 5 | 1 | 3 | 14 |
| Comparative Example 5 | 29 | 257 | A1 | 95 | 10.4 | B1 | 0 | C1 | 5 | 1 | 3 | 14 |
| Comparative Example 6 | 29 | 257 | A1 | 94 | 10.4 | B1 | 1 | C1 | 5 | 0.2 | 22 | 191 |

TABLE 1-continued

| | Base Material | | Release Agent Layer | | | | | | | | |
|---|---|---|---|---|---|---|---|---|---|---|---|
| | Surface Roughness of Second Surface | | Ultraviolet Curable Compound | | | Polyorgano-siloxane | | Photopoly-merization initiator | | | Surface Roughness of Outer Surface | |
| | Arithmetic Average Roughness Ra$_2$ [nm] | Maximum Projection Height Rp$_2$ [nm] | Kind | Blending Amount [Mass Parts] | Content of Reactive Functional Group [Equivalent/kg] | Kind | Blending Amount [Mass Parts] | Kind | Blending Amount [Mass Parts] | Thickness [μm] | Arithmetic Average Roughness Ra$_1$ [nm] | Maximum Projection Height Rp$_1$ [nm] |
| Comparative Example 7 | 42 | 619 | A1 | 94 | 10.4 | B1 | 1 | C1 | 5 | 1 | 6 | 79 |
| Comparative Example 8 | 3 | 15 | A1 | 94 | 10.4 | B1 | 1 | C1 | 5 | 1 | 2 | 8 |

[2] Evaluation

The following evaluations were conducted with respect to the release films for producing the green sheets thus obtained.

[2.1] Curability Evaluation

The surface of the release agent layer of each of the release films for producing the green sheets obtained in the respective Examples and the respective Comparative Examples was reciprocatively polished ten times at a load of 1 kg/cm$^2$ using a waste cloth (made by Ozu Corporation and sold under a trade name "BEMCOT AP-2") containing 3 ml of MEK. Thereafter, the surface of the release agent layer was visually observed. The curability was evaluated under the following evaluation criteria.

A: The release agent layer was not dissolved and exfoliated.
B: The release agent layer was partially dissolved.
C: The release agent layer was completely dissolved and exfoliated.

[2.2] Evaluation of Coatability of Ceramic Slurry 135 mass parts of a mixed solvent of toluene and ethanol (having a mass ratio of 6/4) were added to 100 mass parts of barium titanate powder [BaTio$_3$, produced by Sakai Chemical Industrial Co., Ltd. and sold under a trade name "BT-03"], 8 mass parts of polyvinyl butyral [produced by Sekisui Chemical Co., Ltd. and sold under a trade name "S-LEC B•K BM-2"] as a binder, and 4 mass parts of dioctyl phthalate [produced by KANTO CHEMICAL CO., INC. and sold under a trade name "DIOCTYL PHTHALATE Cica GRADE 1"] as a plasticizer. A Ceramic slurry was prepared by mixing and dispersing these substances with a ball mill. A coated layer was obtained by coating the ceramic slurry, with a die coater, on the surface of the release agent layer of each of the release films for producing the green sheets obtained in the respective Examples and the respective Comparative Examples, such that, when dried, a green sheet had a thickness of 1 μm, a width of 250 mm and a length of m. A release film for producing the green sheet provided with the green sheet was obtained by drying the coated layer at 80° C. for one minute. Thereafter, the release film for producing the green sheet provided with the green sheet was irradiated with light of a fluorescent lamp from a side of the release film for producing the green sheet. A surface of the green sheet was visually observed. The coatability of the ceramic slurry was evaluated under the following evaluation criteria.

A: No pinhole was found in the green sheet.
B: 1 to 5 pinholes were found in the green sheet.
C: 6 or more pinholes were found in the green sheet.

[2.3] Evaluation of Releasability of Green Sheet

The green sheet formed in item [2.2] supra was released from the release film for producing the green sheet. At this time, evaluation was conducted as to whether the green sheet was normally released.

A: The green sheet was smoothly released without being broken, and the green sheet was not left on the release agent layer.
B: The green sheet was released without being broken, while somewhat lacking in smoothness, and the green sheet was not left on the release agent layer.
C: The green sheet was broken when releasing the same or the green sheet could not be released.

[2.4] Evaluation of the Number of Depressed Parts 1

A coating liquid obtained by dissolving a polyvinyl butyral resin in a mixed solvent of toluene and ethanol (having a mass ratio of 6/4) was coated on the release agent layer (the outer surface of the release agent layer) of each of the release films for producing the green sheets obtained in the respective Examples and the respective Comparative Examples, such that, when dried, a polyvinyl butyral resin layer had a thickness of 3 μm. Thus, a coated layer was obtained. The polyvinyl butyral resin layer was formed by drying the coated layer at 80° C. for one minute. Subsequently, a polyester tape was attached to a surface of the polyvinyl butyral resin layer. Then, the release film for producing the green sheet was released from the polyvinyl butyral resin layer, and the polyvinyl butyral resin layer was transferred to the polyester tape. Thereafter, the surface of the polyvinyl butyral resin layer which was previously in contact with the release agent layer of the release film for producing the green sheet was observed using an optical interference type surface profiler [made by Veeco Instruments Inc. and sold under a trade name "WYKO-1100"]. The observation was conducted in a PSI mode and at a magnification of 50. The depressed parts having the shape of the release agent layer transferred thereto and having a depth of 150 nm or greater, which exist in a region of 91.2 μm×119.8 μm of the surface of the polyvinyl butyral resin layer, were counted. The number of the depressed parts was evaluated under the following evaluation criteria. In case where a capacitor was manufactured using the polyvinyl butyral resin layer (the green sheet) evaluated to be the criterion C infra, there was a tendency that short circuit was easily generated due to a decrease in breakdown voltage. However, tests were not conducted in case where the green sheet was evaluated to be the criterion C in item [2.3] supra.
A: The number of the depressed parts was zero.
B: The number of the depressed parts was 1 to 5.
C: The number of the depressed parts was 6 or more.

[2.5] Evaluation of the Number of Depressed Parts 2

A coating liquid obtained by dissolving a polyvinyl butyral resin in a mixed solvent of toluene and ethanol (having a mass ratio of 6/4) was coated on a PET film having a thickness of 50 µm such that, when dried, a polyvinyl butyral resin layer has a thickness of 3 µm. Thus, a coated layer was obtained. The polyvinyl butyral resin layer was formed by drying the coated layer at 80° C. for one minute. A laminated body was obtained by attaching each of the release films for producing the green sheets obtained in the respective Examples and the respective Comparative Examples to the polyvinyl butyral resin layer such that the second surface of the base material of the release film for producing the green sheet makes contact with the polyvinyl butyral resin layer. The laminated body was cut into a size of 100 mm×100 mm. Thereafter, the laminated body was pressed with a load of 5 kg/cm², whereby a shape of projection of the second surface of the base material of each of the release films for producing the green sheets was transferred to the polyvinyl butyral resin layer. Then, the release film for producing the green sheet was released from the polyvinyl butyral resin layer. The number of depressed parts having a depth of 500 nm or greater, which exist on the surface of the polyvinyl butyral resin layer previously kept in contact with the second surface of the base material of the release film for producing the green sheet, was counted. More specifically, the surface of the polyvinyl butyral resin layer was observed using an optical interference type surface profiler [made by Veeco Instruments Inc. and sold under a trade name "WYKO-1100"]. The observation was conducted in a PSI mode and at a magnification of 50. The depressed parts which exist in a region of 91.2 µm×119.8 µm of the surface of the polyvinyl butyral resin layer were counted. The depressed parts had the shape of the second surface transferred thereto. The number of the depressed parts was evaluated under the following evaluation criteria. In case where a capacitor was manufactured using the polyvinyl butyral resin layer (the green sheet) evaluated to be the criterion C infra, there was a tendency that short circuit was easily generated due to a decrease in breakdown voltage.
A: The number of the depressed parts was zero.
B: The number of the depressed parts was 1 to 3.
C: The number of the depressed parts was 4 or more.

[2.6] Evaluation of Handling Ability

The handling ability of each of the release films for producing the green sheets of the respective Examples and the respective Comparative Examples wound in a roll shape was evaluated under the following evaluation criteria.
A: The sliding property of the release film for producing the green sheet was good and the air removal was good when the release film for producing the green sheet was wound in the roll shape. Moreover, the winding deviation of the release film for producing the green sheet could be prevented.
B: The sliding property of the release film for producing the green sheet was somewhat poor and the air removal was somewhat poor when the release film for producing the green sheet was wound in the roll shape. Moreover, the winding deviation of the release film for producing the green sheet was slightly generated but did not matter.
C: The sliding property of the release film for producing the green sheet was poor and the air removal was poor when the release film for producing the green sheet was wound in the roll shape. Moreover, the winding deviation of the release film for producing the green sheet was notably generated.

[2.7] Evaluation of Blocking Property

Each of the release films for producing the green sheets obtained in the respective Examples and the respective Comparative Examples was wound in a roll shape with a width of 400 mm and a length of 5000 m. The roll of the release film for producing the green sheet was stored for 30 days at a temperature of 40° C. and at a humidity of 50% or less. Thereafter, the outward appearance of the roll of the release film for producing the green sheet was visually observed. The blocking property thereof was evaluated under the following evaluation criteria.
A: The outward appearance was not changed from the time when the release film for producing the green sheet was wound in the roll shape (Blocking was not generated).
B: In the roll of the release film for producing the green sheet, there was a region where the hue was partially different (The roll tended to suffer from blocking but was still usable).
C: The hue was different over a wide region of the roll of the release film for producing the green sheet (Blocking was generated).

In case where, like the evaluation criterion C supra, the blocking is generated due to the close contact of the front and rear surfaces of the release film for producing the green sheet and the hue is different over the wide region of the roll of the release film for producing the green sheet, it is sometimes impossible to normally unwind the release film for producing the green sheet. The results are shown in Table 2.

TABLE 2

|  | Curability Evaluation | Evaluation of Coatability of Slurry | Evaluation of Releasability of Green Sheet | Evaluation of the Number of Depressed parts 1 | Evaluation of the Number of Depressed parts 2 | Evaluation of Handling Ability | Evaluation of Blocking Property |
|---|---|---|---|---|---|---|---|
| Example 1 | A | A | A | A | A | A | A |
| Example 2 | A | A | A | A | A | A | A |
| Example 3 | A | A | A | A | A | A | A |

TABLE 2-continued

|  | Curability Evaluation | Evaluation of Coatability of Slurry | Evaluation of Releasability of Green Sheet | Evaluation of the Number of Depressed parts 1 | Evaluation of the Number of Depressed parts 2 | Evaluation of Handling Ability | Evaluation of Blocking Property |
|---|---|---|---|---|---|---|---|
| Example 4 | A | A | A | A | A | A | A |
| Example 5 | A | A | A | A | A | A | A |
| Example 6 | A | A | A | A | A | A | A |
| Example 7 | A | A | A | A | B | A | A |
| Example 8 | A | A | A | A | A | A | A |
| Example 9 | A | A | A | A | A | A | A |
| Example 10 | A | A | A | A | A | A | A |
| Comparative Example 1 | B | A | C | — | A | A | C |
| Comparative Example 2 | B | A | C | — | A | A | C |
| Comparative Example 3 | B | A | C | — | A | A | C |
| Comparative Example 4 | C | A | C | — | A | A | C |
| Comparative Example 5 | A | A | C | — | A | A | A |
| Comparative Example 6 | B | A | C | — | A | A | C |
| Comparative Example 7 | A | A | A | A | C | A | A |
| Comparative Example 8 | A | A | A | A | A | C | C |

As is apparent in Table 2, the release film for producing the green sheet according to the present invention was superior in the coatability of the slurry, the releasability of the formed green sheet and the smoothness of the front and rear surfaces of the green sheet. Furthermore, the release film for producing the green sheet according to the present invention provided the effect of suppressing generation of the pinhole and the partial thickness variation in the green sheet. Moreover, the release film for producing the green sheet according to the present invention showed the superior handling ability during the course of winding the film in the roll shape and was less susceptible to blocking when wound in the roll shape. In addition, the release film for producing the green sheet according to the present invention was superior in the curability of the release-agent-layer-forming material. The release agent layer could be formed even under an air atmosphere. In the comparative examples, however, satisfactory results were not obtained.

INDUSTRIAL APPLICABILITY

The release film for producing the green sheet according to the present invention includes: a base material having a first surface and a second surface; and a release agent layer formed by irradiating an ultraviolet ray to a coated layer and curing the coated layer, wherein the coated layer is formed by coating the first surface of the base material with a release-agent-layer-forming material that contains an ultraviolet curable compound (A) having, in one molecule, three or more reactive functional groups selected from a (meth) acryloyl group, an alkenyl group and a maleimide group, a polyorganosiloxane (B) and an α-aminoalkylphenone-based photopolymerization initiator (C). An average thickness of the release agent layer is in the range of 0.3 to 2 μm. An arithmetic average roughness $Ra_1$ of an outer surface of the release agent layer is 8 nm or less. A maximum projection height $Rp_1$ of the outer surface of the release agent layer is 50 nm or less. An arithmetic average roughness $Ra_2$ of the second surface of the base material is in the range of 5 to 40 nm. A maximum projection height $Rp_2$ of the second surface of the base material is in the range of 60 to 500 nm.

According to the present invention, it becomes possible to prevent generation of a pinhole and a partial thickness variation in a green sheet. The release film for producing the green sheet is capable of obtaining high smoothness of the outer surface of the release agent layer and is capable of providing superior releasability. Accordingly, the present invention is industrially applicable.

EXPLANATION OF REFERENCE NUMERAL

1: release film for producing a green sheet
11: base material
111: first surface of a base material
112: second surface of a base material
12: release agent layer
121: outer surface of a release agent layer

What is claimed is:
1. A release film for producing a green sheet, the release film comprising:
a base material having a first surface and a second surface; and
a release agent layer provided at a side of the first surface of the base material, wherein the release agent layer is formed by irradiating an ultraviolet ray to a coated layer and curing the coated layer, and the coated layer is formed by coating a release-agent-layer-forming material on the side of the first surface of the base material, wherein the release-agent-layer-forming material includes an ultraviolet curable compound (A) having three or more reactive functional groups selected from a (meth)acryloyl group, an alkenyl group and a maleimide group in one molecule thereof, a polyorganosiloxane (B) and an α-aminoalkylphenone-based photopolymerization initiator (C),
wherein an average thickness of the release agent layer is in a range of 0.3 to 2 μm,
wherein an arithmetic average roughness $Ra_1$ of an outer surface of the release agent layer is 8 nm or less and a maximum projection height $Rp_1$ of the outer surface of the release agent layer is 50 nm or less, and wherein an arithmetic average roughness $Ra_2$ of the second surface of the base material is in a range of 5 to 40 nm and a maximum projection height $Rp_2$ of the second surface of the base material is in a range of 60 to 500 nm.

2. The release film of claim 1, wherein a solid component content of the polyorganosiloxane (B) in the release-agent-layer-forming material is in a range of 0.5 to 5 mass %.

3. The release film of claim 1, wherein the polyorganosiloxane (B) is a polyorganosiloxane having a straight or branched molecular chain and includes at least one reactive functional group selected from a group consisting of a (meth)acryloyl group, an alkenyl group and a maleimide group, and
wherein the reactive functional group is bonded, at one or both of terminals of the molecular chain and a side chain of the molecular chain, to silicon atoms of the molecular chain, either directly or through a bivalent linking group.

4. The release film of claim 1, wherein the base material is formed into a laminated body having laminated layers, and at least one of the laminated layers is an antistatic layer.

5. The release film of claim 2, wherein the polyorganosiloxane (B) is a polyorganosiloxane having a straight or branched molecular chain and includes at least one reactive functional group selected from a group consisting of a (meth)acryloyl group, an alkenyl group and a maleimide group, and
wherein the reactive functional group is bonded, at one or both of terminals of the molecular chain and a side chain of the molecular chain, to silicon atoms of the molecular chain, either directly or through a bivalent linking group.

6. The release film of claim 2, wherein the base material is formed into a laminated body having laminated layers, and at least one of the laminated layers is an antistatic layer.

7. The release film of claim 3, wherein the base material is formed into a laminated body having laminated layers, and at least one of the laminated layers is an antistatic layer.

8. A method of producing a release film for producing a green sheet, the method comprising:
preparing a base material having a first surface and a second surface;
preparing a release-agent-layer-forming material that includes an ultraviolet curable compound (A) having three or more reactive functional groups selected from a (meth)acryloyl group, an alkenyl group and a maleimide group in one molecule thereof, a polyorganosiloxane (B) and an α-aminoalkylphenone-based photopolymerization initiator (C); and
forming a release agent layer by irradiating an ultraviolet ray to a coated layer and curing the coated layer,
wherein the coated layer is formed by coating the release-agent-layer-forming material on a side of the first surface of the base material,
wherein an average thickness of the release agent layer is in a range of 0.3 to 2 μm,
wherein an arithmetic average roughness $Ra_1$ of an outer surface of the release agent layer is 8 nm or less and a maximum projection height $Rp_1$ of the outer surface of the release agent layer is 50 nm or less, and
wherein an arithmetic average roughness $Ra_2$ of the second surface of the base material is in a range of 5 to 40 nm and a maximum projection height $Rp_2$ of the second surface of the base material is in a range of 60 to 500 nm.

9. The method of claim 8, wherein, in the forming the release agent layer, the ultraviolet ray is irradiated in an air atmosphere.

10. The method of claim 9, wherein a solid component content of the polyorganosiloxane (B) in the release-agent-layer-forming material is in a range of 0.5 to 5 mass %.

11. The method of claim 8, wherein a solid component content of the polyorganosiloxane (B) in the release-agent-layer-forming material is in a range of 0.5 to 5 mass %.

12. The method of claim 8, wherein, in the preparing the release-agent-layer-forming material, the polyorganosiloxane (B) is a polyorganosiloxane having a straight or branched molecular chain and includes at least one reactive functional group selected from a group consisting of a (meth)acryloyl group, an alkenyl group and a maleimide group, and
wherein the reactive functional group is bonded, at one or both of terminals of the molecular chain and a side chain of the molecular chain, to silicon atoms of the molecular chain, either directly or through a bivalent linking group.

13. The method of claim 9, wherein, in the preparing the release-agent-layer-forming material, the polyorganosiloxane (B) is a polyorganosiloxane having a straight or branched molecular chain and includes at least one reactive functional group selected from a group consisting of a (meth)acryloyl group, an alkenyl group and a maleimide group, and
wherein the reactive functional group is bonded, at one or both of terminals of the molecular chain and a side chain of the molecular chain, to silicon atoms of the molecular chain, either directly or through a bivalent linking group.

14. The method of claim 11, wherein, in the preparing the release-agent-layer-forming material, the polyorganosiloxane (B) is a polyorganosiloxane having a straight or branched molecular chain and includes at least one reactive functional group selected from a group consisting of a (meth)acryloyl group, an alkenyl group and a maleimide group, and
wherein the reactive functional group is bonded, at one or both of terminals of the molecular chain and a side chain of the molecular chain, to silicon atoms of the molecular chain, either directly or through a bivalent linking group.

15. A method of producing a release film for producing a green sheet, the method comprising:
preparing a base material having a first surface and a second surface;
preparing a release-agent-layer-forming material that includes an ultraviolet curable compound (A) having three or more reactive functional groups selected from a (meth)acryloyl group, an alkenyl group and a maleimide group in one molecule thereof, a polyorganosiloxane (B) and an α-aminoalkylphenone-based photopolymerization initiator (C); and
forming a release agent layer by irradiating an ultraviolet ray to a coated layer and curing the coated layer,
wherein the coated layer is formed by coating the release-agent-layer-forming material on a side of the first surface of the base material, and
wherein an arithmetic average roughness $Ra_1$ of an outer surface of the release agent layer is different than an arithmetic average roughness $Ra_2$ of the second surface.

16. The method of claim 15, wherein a maximum projection height $Rp_1$ of the outer surface of the release agent layer is different than a maximum projection height $Rp_2$ of the second surface of the base material.

17. The method of claim 16, wherein the maximum projection height $Rp_1$ of the outer surface of the release agent layer is less than the maximum projection height $Rp_2$ of the second surface of the base material.

18. The method of claim 17, wherein an average thickness of the release agent layer is in a range of 0.3 to 2 μm.

19. The method of claim 18, wherein the arithmetic average roughness $Ra_1$ is not greater than 8 nm and the arithmetic average roughness $Ra_2$ is in a range of 5 to 40 nm.

20. The method of claim 19, wherein the maximum projection height $Rp_1$ is not greater than 50 nm and the maximum projection height $Rp_2$ is in a range of 60 to 500 nm.

* * * * *